United States Patent
Komai

(10) Patent No.: US 11,706,541 B2
(45) Date of Patent: Jul. 18, 2023

(54) IMAGE SENSOR, IMAGE-CAPTURING APPARATUS, AND SEMICONDUCTOR MEMORY

(71) Applicant: NIKON CORPORATION, Tokyo (JP)

(72) Inventor: Atsushi Komai, Tokorozawa (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 17/368,180

(22) Filed: Jul. 6, 2021

(65) Prior Publication Data
US 2021/0337152 A1 Oct. 28, 2021

Related U.S. Application Data

(63) Continuation of application No. 16/079,513, filed as application No. PCT/JP2017/008022 on Feb. 28, 2017, now abandoned.

(30) Foreign Application Priority Data

Mar. 30, 2016 (JP) .................................. 2016-069737

(51) Int. Cl.
*H04N 25/75* (2023.01)
*H01L 27/146* (2006.01)
(Continued)

(52) U.S. Cl.
CPC ........... *H04N 25/75* (2023.01); *H01L 27/146* (2013.01); *H01L 27/14634* (2013.01);
(Continued)

(58) Field of Classification Search
CPC ............... H04N 5/378; H04N 5/37452; H04N 5/37457; H04N 5/379; H01L 27/146; H01L 27/14634; H01L 27/1464
See application file for complete search history.

(56) References Cited

U.S. PATENT DOCUMENTS 10,264,199 B2   4/2019   Takayanagi et al.
2007/0045677 A1 3/2007   Lee et al.
(Continued)

FOREIGN PATENT DOCUMENTS

CN   103004180 A   3/2013
CN   106664382 A   5/2017
(Continued)

OTHER PUBLICATIONS

Mar. 8, 2022 Office Action issued in Japanese Patent Application No. 2021-006726.
(Continued)

*Primary Examiner* — Sinh Tran
*Assistant Examiner* — Zhenzhen Wu
(74) *Attorney, Agent, or Firm* — Oliff PLC

(57) ABSTRACT

A first circuit constituting a plurality of first circuit in a first direction, which stores a signal output from a pixel having a photoelectric conversion unit; a first control unit to which the plurality of first circuits are connected and outputs a first signal for outputting signals stored in the plurality of first circuits; a readout unit that reads out the signal output from the first circuit; a plurality of second circuits that are connected to the first control unit, a plurality of sets of the plurality of second circuits in the first direction; and a second control unit that controls a readout of the signal by the readout unit. The first control unit outputs a second signal to the plurality of second circuits together with the first signal; and the second control unit controls the readout of the signal by the readout unit, based on the second signal.

17 Claims, 11 Drawing Sheets

(51) Int. Cl.
*H04N 25/79* (2023.01)
*H04N 25/771* (2023.01)
*H04N 25/778* (2023.01)

(52) U.S. Cl.
CPC ......... *H04N 25/771* (2023.01); *H04N 25/778* (2023.01); *H04N 25/79* (2023.01); *H01L 27/1464* (2013.01)

(56) References Cited

U.S. PATENT DOCUMENTS

| | | |
|---|---|---|
| 2008/0042046 A1 | 2/2008 | Mabuchi |
| 2008/0043128 A1 | 2/2008 | Poonnen et al. |
| 2008/0253210 A1 | 10/2008 | Lee et al. |
| 2008/0258047 A1 | 10/2008 | Sakakibara et al. |
| 2010/0013976 A1 | 1/2010 | Sakakibara et al. |
| 2010/0091160 A1 | 4/2010 | Murakami |
| 2011/0279721 A1 | 11/2011 | McMahon |
| 2012/0008029 A1 | 1/2012 | Matsuda et al. |
| 2013/0068929 A1 | 3/2013 | Solhusvik et al. |
| 2013/0308023 A1 | 11/2013 | Sugawa et al. |
| 2015/0029375 A1* | 1/2015 | Sugawa ................ H04N 25/77 348/308 |
| 2015/0070547 A1* | 3/2015 | Dai ........................ H04N 25/76 348/302 |
| 2016/0088251 A1 | 3/2016 | Luo et al. |
| 2016/0211299 A1 | 7/2016 | Arita |
| 2016/0373668 A1* | 12/2016 | Komai ................ H04N 5/3745 |
| 2017/0230598 A1 | 8/2017 | Takayanagi et al. |
| 2017/0244397 A1 | 8/2017 | Tsukuda et al. |
| 2017/0302873 A1 | 10/2017 | Hagihara |
| 2018/0146154 A1 | 5/2018 | Sato et al. |
| 2018/0175083 A1* | 6/2018 | Takahashi ............. H01L 27/146 |
| 2019/0052788 A1 | 2/2019 | Liu |
| 2020/0106983 A1 | 4/2020 | Kanehara et al. |

FOREIGN PATENT DOCUMENTS

| | | |
|---|---|---|
| JP | 2008-048313 A | 2/2008 |
| JP | 2008-271280 A | 11/2008 |
| JP | 2010-225927 A | 10/2010 |
| JP | 2014-531820 A | 11/2014 |
| WO | 2012/107995 A1 | 8/2012 |
| WO | 2016/009942 A1 | 1/2016 |

OTHER PUBLICATIONS

Jul. 28, 2021 Office Action issued in Chinese Patent Application No. 201780018344.7.
Apr. 4, 2017 Search Report issued in International Patent Application No. PCT/JP2017/008022.
Oct. 7, 2019 Extended European Search Report issued in European Patent Application No. 17774029.7.
Nov. 12, 2019 Office Action issued in Japanese Patent Application No. 2018-508836.
May 26, 2020 Office Action issued in U.S. Appl. No. 16/079,513.
Apr. 7, 2020 Office Action issued in Japanese Patent Application No. 2018-508836.
May 20, 2020 Office Action issued in Chinese Patent Application No. 201780018344.7.
Sep. 18, 2020 Office Action issued in European Patent Application No. 17774029.7.
Oct. 20, 2020 Decision of Refusal issued in Japanese Patent Application No. 2018-508836.
Oct. 20, 2020 Decision of Dismissal of Amendment issued in Japanese Patent Application No. 2018-508836.
Jan. 6, 2021 Office Action issued in U.S. Appl. No. 16/079,513.
Mar. 12, 2021 Office Action issued in Chinese Patent Application No. 201780018344.7.

* cited by examiner

IMAGE SENSOR, IMAGE-CAPTURING APPARATUS, AND SEMICONDUCTOR MEMORY

CROSS-REFERENCE TO RELATED APPLICATION(S)

This application is a continuation of U.S. application Ser. No. 16/079,513 filed Aug. 23, 2018, which is a National Stage of PCT/JP2017/008022 filed Feb. 28, 2017, and is based on and claims priority under 35 U.S.C. 119 from Japanese Patent Application No. 2016-069737 filed on Mar. 30, 2016. The entire contents of the above applications are incorporated herein by reference.

TECHNICAL FIELD

The present invention relates to an image sensor, an image-capturing apparatus, and a semiconductor memory.

BACKGROUND ART

PTL1 discloses an image sensor in which chips having pixels formed thereon and chips having pixel driving circuits formed thereon are stacked on each other, the pixel driving circuits driving the pixels. Such an image sensor cannot increase a speed of reading out signals from the pixels when the number of pixels increases.

CITATION LIST

Patent Literature

PTL1: Japanese Laid-Open Patent Publication No. 2010-225927

SUMMARY OF INVENTION

According to the 1st aspect of the present invention, an image sensor comprises: a first circuit constituting a plurality of first circuits provided in a first direction, which stores a signal output from a pixel having a photoelectric conversion unit; a first control unit to which the plurality of first circuits are connected and which outputs a first signal for outputting signals stored in the plurality of first circuits; a readout unit that reads out the signal output from the first circuit; a plurality of second circuits that are connected to the first control unit, a plurality of sets of the plurality of second circuits being provided in the first direction; and a second control unit that controls a readout of the signal by the readout unit. The first control unit outputs a second signal to the plurality of second circuits together with the first signal; and the second control unit controls the readout of the signal by the readout unit, based on the second signal.

According to the 2nd aspect of the present invention, in the image sensor according to the 1st aspect, it is preferred that the plurality of second circuits are connected to the first control unit via a signal line; and the second control unit is connected to the signal line after at least one of the plurality of second circuits is connected in the first direction.

According to the 3rd aspect of the present invention, in the image sensor according to the 2nd aspect, it is preferred that the second control unit is connected to the signal lines via connection units, the connection units being located between the plurality of first circuits.

According to the 4th aspect of the present invention, in the image sensor according to any one of the 1st to 3rd aspects, it is preferred that the number of the second circuits provided in the first direction is same as the number of the first circuits provided in the first direction.

According to the 5th aspect of the present invention, in the image sensor according to any one of the 1st to 4th aspects, it is preferred that the first circuit and the second circuit are circuits having same configuration or circuits having same resistance value.

According to the 6th aspect of the present invention, in the image sensor according to any one of the 1st to 5th aspects, it is preferred that a plurality of sets of the plurality of first circuits arranged in the first direction, are arranged in a direction intersecting the first direction; and the first control unit sequentially outputs the first signals to the plurality of first circuits provided in a direction intersecting the first direction, and outputs the second signals to the plurality of second circuits provided in the first direction.

According to the 7th aspect of the present invention, in the image sensor according to any one of the 1st to 6th aspects, it is preferred that a plurality of readout units containing the readout unit are provided; and the plurality of readout units read out the signals output from the plurality of respective first circuits.

According to the 8th aspect of the present invention, in the image sensor according to the 7th aspect, it is preferred that the plurality of readout units are provided in the first direction; and the second control unit controls the plurality of readout units provided in the first direction based on the second signal.

According to the 9th aspect of the present invention, in the image sensor according to any one of the 1st to 8th aspects, it is preferred that the second control unit controls a timing of the readout of the signal by the readout unit based on the second signal.

According to the 10th aspect of the present invention, in the image sensor according to any one of the 1st to 9th aspects, it is preferred that the second control unit performs the readout of the signal by the readout unit after a predetermined time has elapsed since the second signal was received.

According to the 11th aspect of the present invention, in the image sensor according to the 10th aspect, it is preferred that the second control unit changes the predetermined time based on a spacing between the first circuit and the readout unit.

According to the 12th aspect of the present invention, in the image sensor according to the 10th or the 11th aspect, it is preferred that the second control unit reduces the predetermined time as a spacing between the first circuit and the readout unit is larger.

According to the 13th aspect of the present invention, in the image sensor according to any one of the 1st to 12th aspects, it is preferred that a plurality of second control units containing the second control unit are provided in the first direction.

According to the 14th aspect of the present invention, in the image sensor according to any one of the 1st to 13th aspects, it is preferred that the second control unit is a delay circuit.

According to the 15th aspect of the present invention, in the image sensor according to any one of the 1st to 14th aspects, it is preferred that the image sensor further comprises: an amplifying unit that amplifies a signal output from the first circuit; and a third control unit that controls an amplification of the signal by the amplifying unit. The first control unit outputs a second signal to the plurality of second circuits together with the first signal; and the third control unit controls the amplification of the signal by the amplifying unit based on the second signal.

According to the 16th aspect of the present invention, in the image sensor according to the 15th aspect, it is preferred that a plurality of amplifying units containing the amplifying unit are provided; and the plurality of amplifying units respectively amplify signals output from the plurality of first circuits.

According to the 17th aspect of the present invention, in the image sensor according to the 15th or the 16th aspect, it is preferred that a plurality of amplifying units containing the amplifying unit are provided in the first direction; and the third control unit controls the plurality of amplifying units provided in the first direction based on the second signal.

According to the 18th aspect of the present invention, in the image sensor according to any one of the 15th to 17th aspects, it is preferred that the third control unit controls a timing of the amplification of the signal by the amplifying unit based on the second signal.

According to the 19th aspect of the present invention, in the image sensor according to any one of 15th to 18th aspects, it is preferred that the third control unit performs the amplification of the signal by the amplifying unit after a predetermined time has elapsed since the second signal was input.

According to the 20th aspect of the present invention, in the image sensor according to the 19th aspect, it is preferred that the third control unit changes the predetermined time based on a spacing between the first circuit and the amplifying unit.

According to the 21st aspect of the present invention, in the image sensor according to the 19th or the 20th aspect, it is preferred that the third control unit reduces the predetermined time as a spacing between the first circuit and the amplifying unit is larger.

According to the 22nd aspect of the present invention, in the image sensor according to any one of the 15th to 21th aspects, it is preferred that a plurality of third control units containing the third control unit are provided in a direction intersecting the first direction.

According to the 23rd aspect of the present invention, in the image sensor according to any one of the 15th to 22th aspects, it is preferred that the third control unit is a delay circuit.

According to the 24th aspect of the present invention, in the image sensor according to any one of the 15th to 23th aspects, it is preferred that the readout unit reads out the signal amplified by the amplifying unit.

According to the 25th aspect of the present invention, in the image sensor according to any one of the 1st to 24th aspects, it is preferred that at least one third circuit which is provided between at least one of the plurality of first circuits provided in the first direction and the first control unit and to which the first signal is input.

According to the 26th aspect of the present invention, in the image sensor according to the 25th aspect, it is preferred that the third circuit stores or amplifies at least the first signal input.

According to the 27th aspect of the present invention, in the image sensor according to any one of the 1st to 24th aspects, it is preferred that at least one third circuit which is provided between at least one of the plurality of second circuits provided in the first direction and the first control unit and to which the second signal is input.

According to the 28th aspect of the present invention, in the image sensor according to the 27th aspect, it is preferred that the third circuit stores or amplifies at least the second signal input.

According to the 29th aspect of the present invention, in the image sensor according to any one of the 1st to 28th aspects, it is preferred that a first substrate in which a plurality of photoelectric conversion units containing the photoelectric conversion unit are provided and a second substrate in which at least one of a set of the plurality of first circuits, a set of the plurality of second circuits, the readout unit, and the second control unit is provided are provided from a side on which light is incident.

According to the 30th aspect of the present invention, in the image sensor according to the 29th aspect, it is preferred that the plurality of photoelectric conversion units are provided at a first pitch in the first substrate; the plurality of first circuits are provided at a second pitch smaller than the first pitch in the second substrate; and the plurality of second circuits are provided at the second pitch in the second substrate.

According to the 31st aspect of the present invention, an image sensor comprises: a plurality of first circuits storing signals each output from a pixel having a photoelectric conversion unit; a first control unit to which the plurality of first circuits are connected and which outputs a first signal for outputting the signals stored in the plurality of first circuits; an amplifying unit that amplifies the signals output from the first circuits; a plurality of second circuits that are connected to the first control unit, a plurality of sets of the plurality of second circuits being provided in the first direction; and a second control unit that controls an amplification of the signals by the amplifying unit. The first control unit outputs a second signal to the plurality of second circuits together with the first signal; and the second control unit controls the amplification of the signals by the amplifying unit based on the second signal.

According to the 32nd aspect of the present invention, an image-capturing apparatus comprises: the image sensor according to any one of the 1st to 31st aspects; and an image generation unit that generates image data based on a signal from the image sensor.

According to the 33rd aspect of the present invention, a semiconductor memory comprises: a plurality of first circuits provided in a first direction, which store signals; a first control unit to which the plurality of first circuits are connected and which outputs a first signal for outputting the signals stored in the plurality of first circuits; a readout unit that reads out the signals output from the first circuits; a plurality of second circuits that are connected to the first control unit, a plurality of sets of the plurality of second circuits being provided in the first direction; and a second control unit that controls a readout of the signals by the readout unit. The first control unit outputs a second signal to the plurality of second circuits together with the first signal; and the second control unit controls the readout of the signals by the readout unit based on the second signal.

DESCRIPTION OF EMBODIMENTS

First Embodiment

Figure 1:
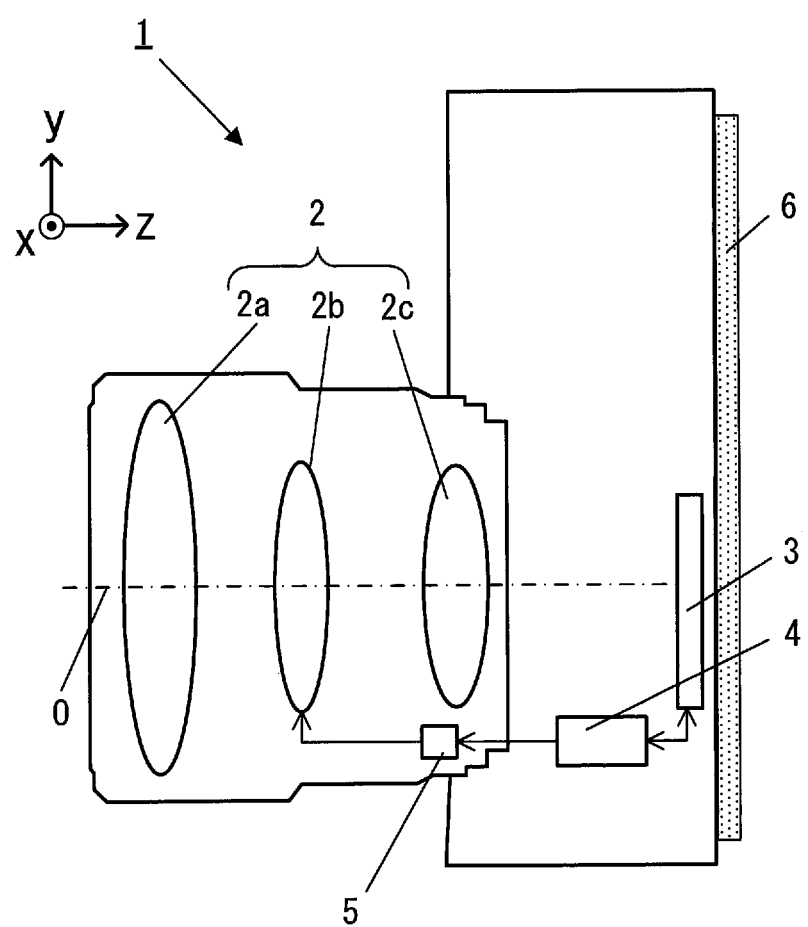
FIG. 1 is a cross-sectional view schematically illustrating a configuration of an image-capturing apparatus.

FIG. 1 is a cross-sectional view schematically illustrating a configuration of an image-capturing apparatus using an image sensor according to a first embodiment. The image-capturing apparatus 1 includes an image-capturing optical system 2, an image sensor 3, a control unit 4, a lens driving unit 5, and a display unit 6.

The image-capturing optical system 2 forms a subject image on an image-capturing surface of the image sensor 3. The image-capturing optical system 2 includes a lens 2a, a focusing lens 2b, and a lens 2c. The focusing lens 2b is a lens for performing focal adjustment of the image-capturing optical system 2. The focusing lens 2b is capable of being driven in an optical axis O direction.

The lens driving unit 5 has an actuator (not illustrated). Using the actuator, the lens driving unit 5 drives the focusing lens 2b by a desired amount in the optical axis O direction. The image sensor 3 captures the subject image and outputs an image. The control unit 4 controls parts such as the image sensor 3. The control unit 4 performs image processing and the like on an image signal output by the image sensor 3 to record the image signal on a recording medium (not illustrated) or display an image on the display unit 6. The display unit 6 is a display device having a display member such as a liquid crystal panel.

Figure 2:
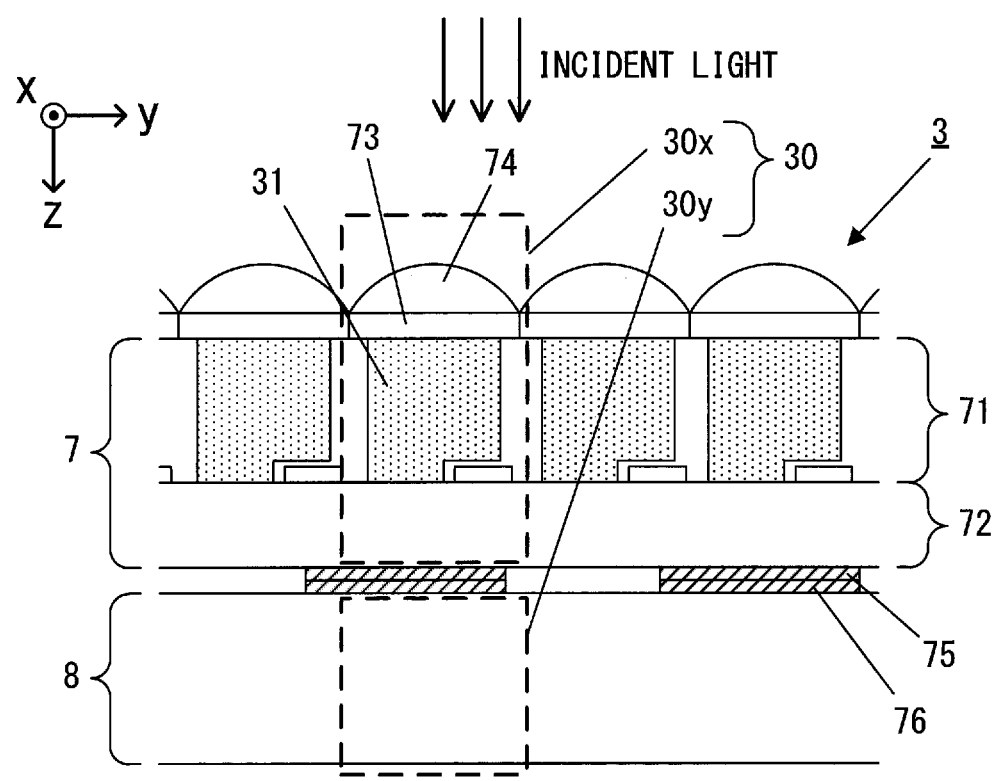
FIG. 2 is a cross-sectional view of an image sensor.

FIG. 2 is a cross-sectional view of the image sensor 3. Note that FIG. 2 illustrates only a partial cross section of the entire image sensor 3. The image sensor 3 is a so-called back side illumination type image sensor. The image sensor 3 outputs a signal based on an electric charge obtained by photoelectrically converting light incident from the top side (−Z direction side) in the plane of paper. The image sensor 3 includes a first semiconductor substrate 7 and a second semiconductor substrate 8. In the image sensor 3, the first semiconductor substrate 7 and the second semiconductor substrate 8 are stacked from the −Z direction side.

The first semiconductor substrate 7 includes at least a PD (photodiode) layer 71 and a wiring layer 72. In the first semiconductor substrate 7, the PD layer 71 and the wiring layer 72 are arranged from the −Z direction side. In the PD layer 71, a plurality of photodiodes 31 are arranged two-dimensionally. Various circuits (described later) for converting and storing the signal based on the electric charge generated by the photodiode 31 are arranged on the second semiconductor substrate 8.

A plurality of color filters 73, each corresponding to an individual one of the plurality of photodiodes 31, are provided on the light incident side (−Z direction side) of the PD layer 71. Different types of color filters 73 are provided, which transmit different wavelength ranges corresponding to, for example, red (R), green (G), or blue (B). Three types of color filters 73 corresponding to, for example, red (R), green (G), and blue (B), are arranged in a Bayer array.

A plurality of microlenses 74, each corresponding to an individual one of the plurality of color filters 73, are provided on the light incident side of the color filter 73. The microlens 74 converges the incident light toward the corresponding photodiode 31. After the incident light has passed through the microlens 74, only a part of the wavelength range of the incident light is transmitted through the color filter 73 to be incident on the photodiode 31. The photodiode 31 photoelectrically converts the incident light to generate an electric charge.

A plurality of bonding pads 75 are arranged on a surface of the wiring layer 72. A plurality of bonding pads 76 corresponding to the plurality of bonding pads 75 are arranged on a surface of the second semiconductor substrate 8 facing to the wiring layer 72. The plurality of bonding pads 75 and the plurality of bonding pads 76 are bonded to each other. The first semiconductor substrate 7 and the second semiconductor substrate 8 are electrically connected to each other via the plurality of bonding pads 75 and the plurality of bonding pads 76.

The image sensor 3 has a plurality of pixel units 30. Details thereof will be described later. One pixel unit 30 includes a first pixel unit 30x provided in the first semiconductor substrate 7 and a second pixel unit 30y provided in the second semiconductor substrate 8. One first pixel unit 30x includes one microlens 74, one color filter 73, one photodiode 31, and other elements. The first pixel unit 30x additionally includes various circuits (described later) provided in the first semiconductor substrate 7. The second pixel unit 30y includes various circuits (described later) provided in the second semiconductor substrate 8.

As the number of the pixel units 30 in the image sensor 3 increases, it becomes difficult to read out signals from the image units 30 at a high speed. As the number of the pixel units 30 increases, the number of times of reading out the signals from the pixel units 30 increases. As a result, a frequency of a control signal (row selection signal as described later) for controlling the readout of the signals from the pixel units 30 becomes high. A control signal having a high frequency is greatly affected by various circuits including the pixel units 30, control lines, signal lines, and the like. For example, a delay of the control signal occurs due to resistance of various circuits including the pixel units 30, and wiring resistance of control lines and signal lines. If the delay of the control signal occurs, the signal of the pixel cannot be read out with a high accuracy. In the present embodiment, an image sensor capable of reading out a signal from a pixel at a high speed and with a high accuracy even when a delay of a control signal occurs will be described.

Figure 3:
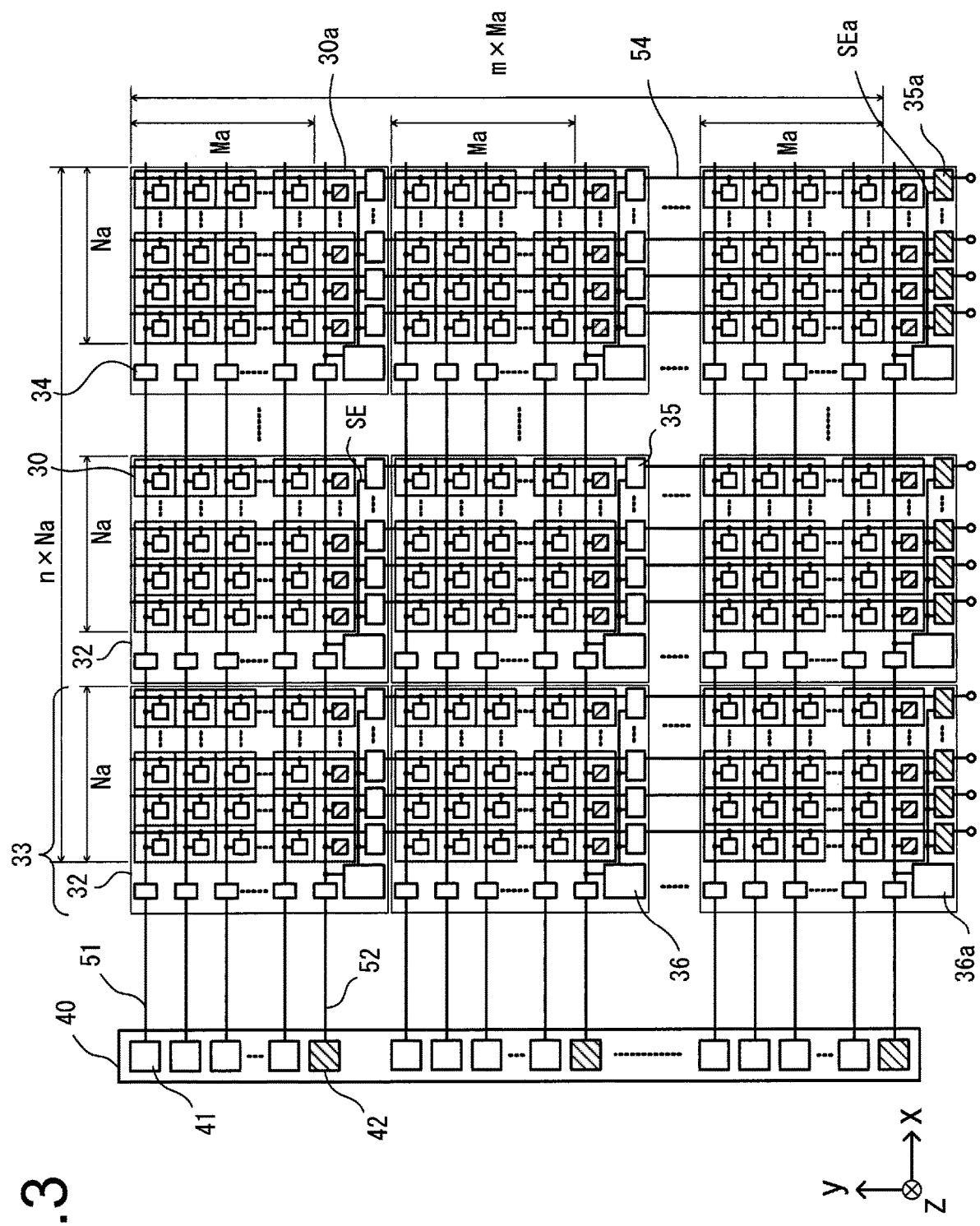
FIG. 3 is a plan view schematically illustrating a configuration of the image sensor.

FIG. 3 is a circuit diagram schematically illustrating a configuration of the image sensor 3. Note that the circuit diagram illustrated in FIG. 3 includes both a circuit provided in the first semiconductor substrate 7 and a circuit provided in the second semiconductor substrate 8. The image sensor 3 has a row selection circuit 40 and n (more than one) pixel block columns 33 arranged in the horizontal direction (x direction). Each pixel block column 33 has m (more than one) pixel blocks 32 arranged in the vertical direction (y direction). In other words, the image sensor 3 has m×n pixel blocks 32 in total.

Each pixel block 32 has Ma×Na pixel units 30 in total, which are arranged in Ma rows and Na columns. Since there are m×n pixel blocks 32 in total as described above, there are m×n×Ma×Na pixel units 30 in total. Note that the pixel units 30 are arranged in square in FIG. 3; however, the pixel units 30 may be arranged in a form different from square.

Each pixel block 32 includes Na dummy pixel units 30a, Ma+1 relay buffers 34, Na relay amplifier circuits 35, and one relay amplifier control circuit 36. The Na dummy pixel units 30a are arranged in a row next to the lowermost row of the pixel block 32 in the same manner as one row of the pixel block 32.

The row selection circuit 40 has Ma×m (more than one) row selection signal output units 41 and m (more than one) relay signal output units 42. Each row selection signal output unit 41 outputs a row selection signal for outputting a signal from each of n×Na image units 30 arranged in the horizontal direction (x direction). Each time a row selection signal is output from the row selection signal output unit 41, the relay signal output unit 42 outputs a relay signal to n×Na dummy pixel unit 30a arranged in the horizontal direction (x direction). The row selection signal and the relay signal are described later. The number of the row selection signal output units 41 is the same as the number of rows of the pixel units 30, and the number of the relay signal output units 42 is the same as the number of rows of the dummy pixel units 30a. The row selection signal output units 41 are arranged in a column. For every Ma row selection signal output units 41, one relay signal output unit 42 is arranged. In other words, the arrangement of Ma row selection signal output units 41 and one relay signal output unit 42 is repeated m times.

The image sensor 3 has Ma×m (more than one) row selection signal lines 51 and m (more than one) relay signal lines 52. In other words, the number of the row selection signal lines 51 is the same as the number of rows of the pixel units 30, and the number of the relay signal lines 52 is the same as the number of rows of the dummy pixel units 30a.

Each row selection signal line 51 connects its corresponding row selection signal output unit 41 to n×Na pixel units 30. The n×Na pixel units 30 are a plurality of pixel units 30 arranged in the same row, which are included in respective pixel blocks 32 adjacent to each other in the horizontal direction. A relay buffer 34 is provided between the row selection signal output unit 41 and the plurality of pixel units 30. The row selection signal is input to the relay buffer 34 provided between the row selection signal output unit 41 and the plurality of pixel units 30. The relay buffer 34 latches (stores) the row selection signal input or amplifies the level of the row selection signal. Relay buffers 34 are also provided between the plurality of pixel units 30 and the plurality of pixel units 30, which are included in respective pixel blocks 32 adjacent to each other in the horizontal direction, arranged in the same row.

Each relay signal line 52 connects its corresponding relay signal output unit 42 and n×Na dummy pixel units 30a. The n×Na dummy pixel units 30a are a plurality of dummy pixel units 30a arranged in the same row, which are included in respective pixel blocks 32 adjacent to each other in the horizontal direction. A relay buffer 34 is provided between the relay signal output unit 42 and the plurality of dummy pixel units 30a. The relay signal is input to the relay buffer 34 provided between the relay signal output unit 42 and the plurality of dummy pixel units 30a. The relay buffer 34 latches (stores) the relay signal input or amplifies the level of the relay signal. Relay buffers 34 are also provided between the plurality of dummy pixel units 30a and the plurality of dummy pixel units 30a, which are included in respective pixel blocks 32 adjacent to each other in the horizontal direction, arranged in the same row.

In each pixel block 32, a relay amplifier control circuit 36 is connected to a relay signal line 52. The relay amplifier control circuit 36 is connected to Na relay amplifier circuits 35 arranged in one row in the pixel block 32 by a relay amplifier control line SE.

Among the m×n pixel blocks 32, a pixel block 32 in the lowermost row has an output amplifier control circuit 36a instead of the relay amplifier control circuit 36, an output amplifier circuit 35a instead of the relay amplifier circuit 35, and an output amplifier control line SEa instead of the relay amplifier control line SE.

The image sensor 3 has n×Na output signal lines 54 (vertical signal lines). In other words, the number of the output signal lines 54 is the same as the number of columns of the pixel units 30. The output signal line 54 connects m×Ma pixel units 30. The m×Ma pixel units 30 are a plurality of pixel units 30 arranged in the same row, which are included in respective pixel blocks 32 (pixel blocks 32 arranged in the vertical direction) in a pixel block column 33. Relay amplifier circuits 35 are also provided between the plurality of pixel units 30 and the plurality of pixel units 30, which are included in respective pixel blocks 32 adjacent to each other in the vertical direction, arranged in the same row. The pixel block 32 arranged in the lowermost row has an output amplifier circuit 35a instead of the relay amplifier circuit 35. The output amplifier circuit 35a is connected to the output signal line 54 in the same manner as the relay amplifier circuit 35.

Note that FIG. 3 illustrates each of the row selection signal lines 51, the relay signal lines 52, the relay amplifier control lines SE, and the output signal lines 54 as one straight line, for convenience. Actually, these signal lines are each composed of a plurality of signal lines (as described later).

A frame memory (not illustrated) is further connected to the output amplifier circuits 35a. The relay amplifier circuit 35 outputs (relays) the output signal input from the upper side in the plane of paper to a pixel block 32 located on the lower side in the plane of paper, while the output amplifier circuit 35a outputs the output signal input from the upper side in the plane of paper to the frame memory (not illustrated).

The frame memory (not illustrated) is a memory capable of storing image data (output signal) for one screen. A photoelectric conversion signal from each pixel unit 30 output from the output amplifier circuits 35a is stored at a predetermined address in the frame memory corresponding to a position of the pixel unit 30. When the readout of the photoelectric conversion signals from all the pixel units 30 is completed, image data for one screen is held in the frame memory.

Note that the frame memory (not illustrated) may be provided in the second semiconductor substrate 8, or may be provided in a semiconductor substrate different from the first semiconductor substrate 7 and the second semiconductor substrate 8. The semiconductor substrate may be stacked with the first semiconductor substrate 7 and the second semiconductor substrate 8, or may be provided elsewhere.

Figure 4:
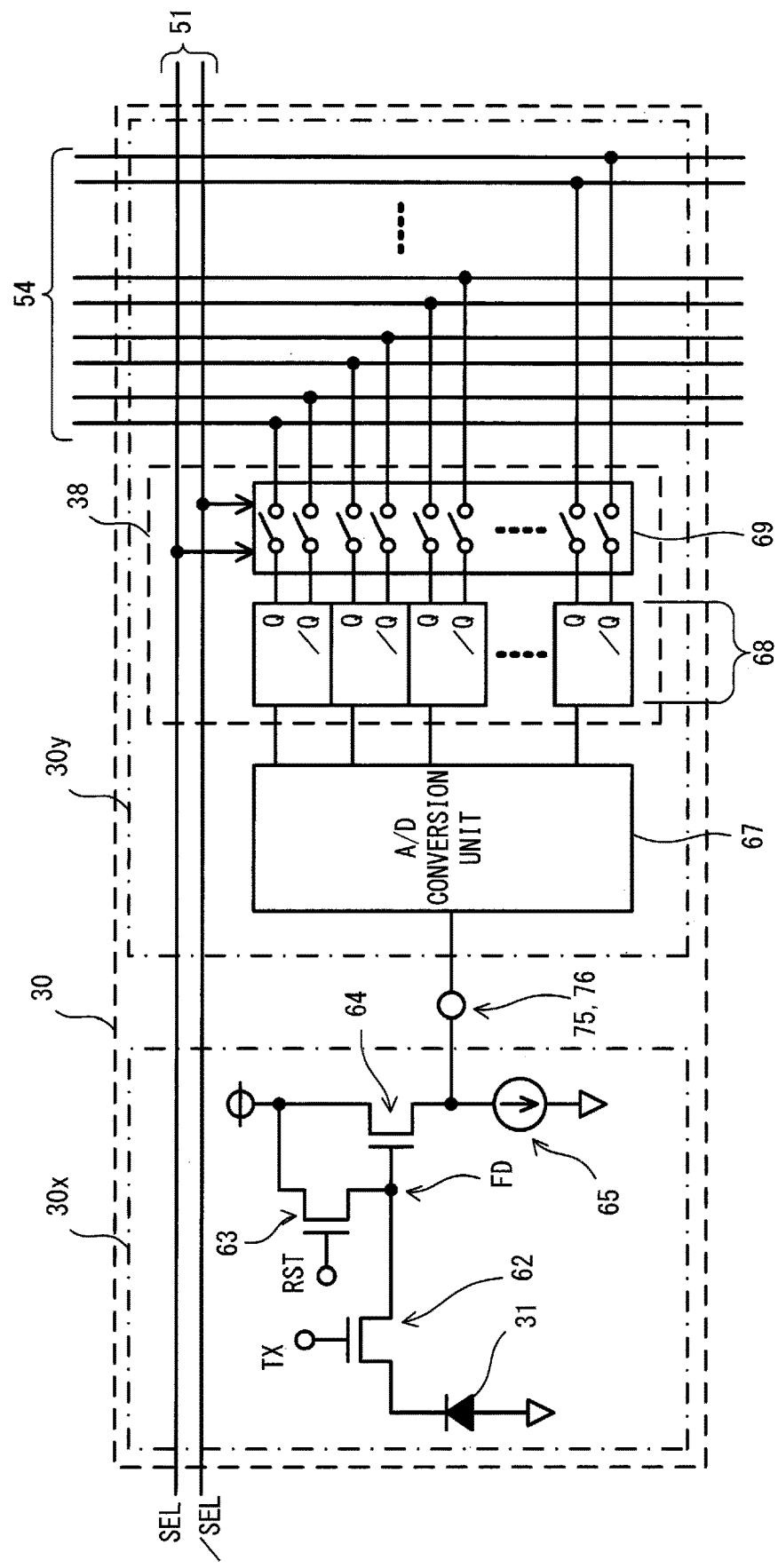
FIG. 4 is a circuit diagram schematically illustrating a configuration of a pixel unit.

FIG. 4 is a circuit diagram schematically illustrating a configuration of a pixel unit 30. The pixel unit 30 includes a first pixel unit 30x provided in the first semiconductor substrate 7 and a second pixel unit 30y provided in the second semiconductor substrate 8. The first pixel unit 30x and the second pixel unit 30y are electrically connected to each other by the bonding pads 75, 76.

The first pixel unit 30x includes a photodiode 31, a transfer transistor 62, a reset transistor 63, an amplification transistor 64, and a constant current source 65. The photodiode 31 photoelectrically converts the incident light to generate a signal electric charge. The signal charge generated by the photodiode 31 is transferred by the transfer transistor 62 to a floating diffusion FD provided between the transfer transistor 62, the reset transistor 63, and the amplification transistor 64. The amplification transistor 64 outputs a signal voltage according to the amount of the signal charge accumulated in the floating diffusion FD to the second pixel unit 30y via the bonding pads 75, 76. The reset transistor 63 resets the signal charge accumulated in the floating diffusion FD and the photodiode 31.

The second pixel unit 30y includes an A/D conversion unit 67 and a storage unit 38. The signal voltage output from the first pixel unit 30x via the bonding pads 75, 76 is converted into a digital value by the A/D conversion unit 67. The A/D conversion unit 67 outputs a K-bit digital signal to the storage unit 38 via K signal lines.

The storage unit 38 includes K storage circuits 68 and selection switches 69. Each storage circuit 68 is a circuit for storing a 1-bit digital value, such as a flip-flop. With the K storage circuits 68, the storage unit 38 stores the K-bit digital signal (digital value) output by the A/D conversion unit 67.

The output signal line 54 is composed of K×2 signal lines to transmit complementary signals having a K-bit digital value as output signals. In response to the row selection signal output from the row selection signal output unit 41 to the row selection signal line 51, the selection switches 69 output the K-bit digital signal stored by the K storage circuits 68 to the output signal lines 54. The row selection signal line 51 is composed of two signal lines SEL, /SEL. The row selection signal includes complementary signals, and a signal obtained by inverting the level (H (High) level or L (Low) level) of the signal line SEL is output to the signal line /SEL.

Figure 5:
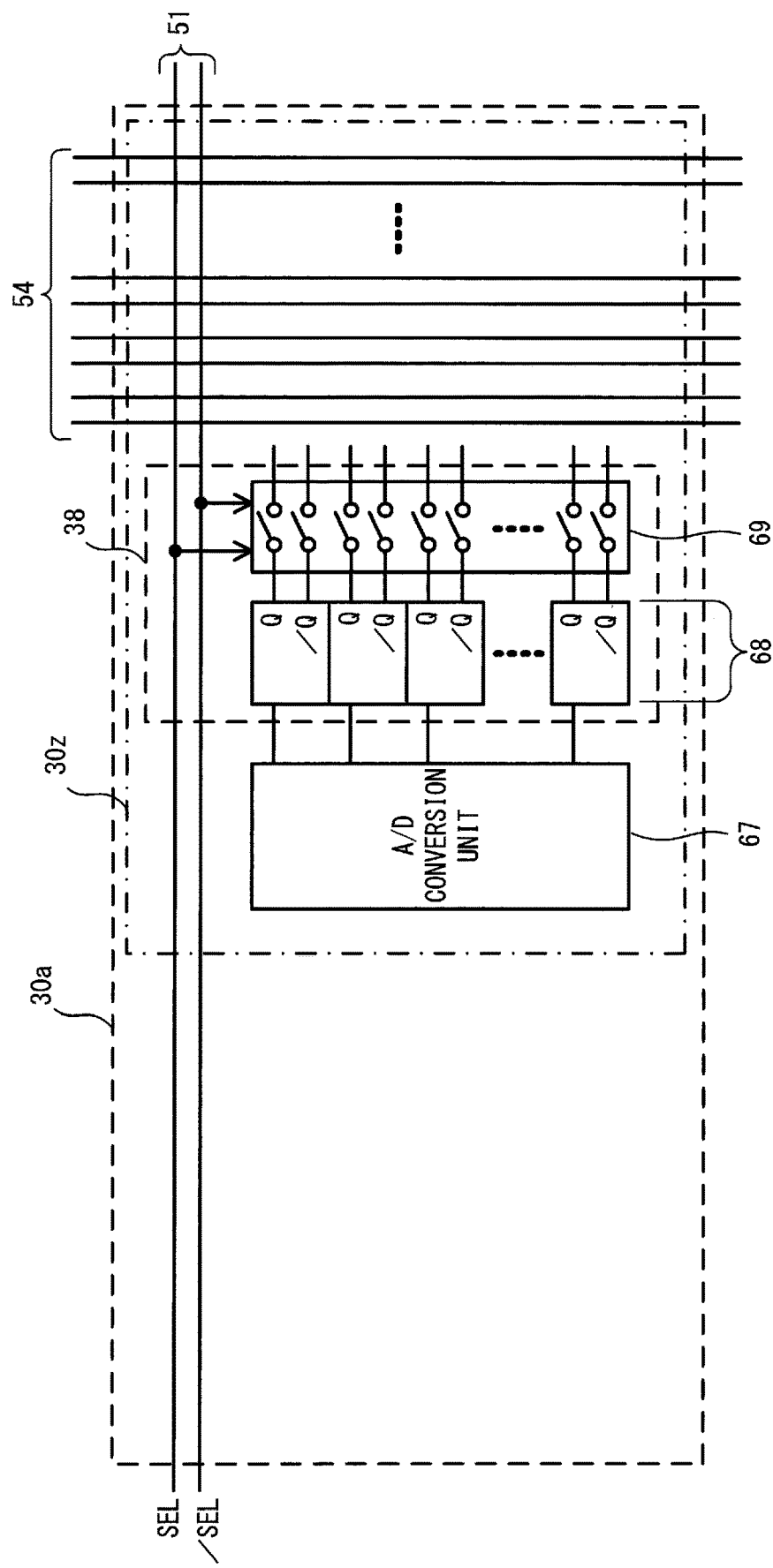
FIG. 5 is a circuit diagram schematically illustrating a configuration of a dummy pixel unit.

FIG. 5 is a circuit diagram schematically illustrating a configuration of a dummy pixel unit 30a. The dummy pixel unit 30a has a second dummy pixel unit 30z provided in the second semiconductor substrate 8. The second dummy pixel unit 30z corresponds to the second pixel unit 30y of the pixel unit 30. The dummy pixel unit 30a may have no configuration corresponding to the first pixel unit 30x of the pixel unit 30. The dummy pixel unit 30a may be a circuit having a configuration corresponding to that of the second pixel unit 30y or a circuit having a resistance value corresponding to that of the second pixel unit 30y. The second dummy pixel unit 30z is configured in the same manner as the second pixel unit 30y, but is not connected to any output signal line 54. Note that the second dummy pixel unit 30z may have no A/D conversion unit 67.

Figure 6:
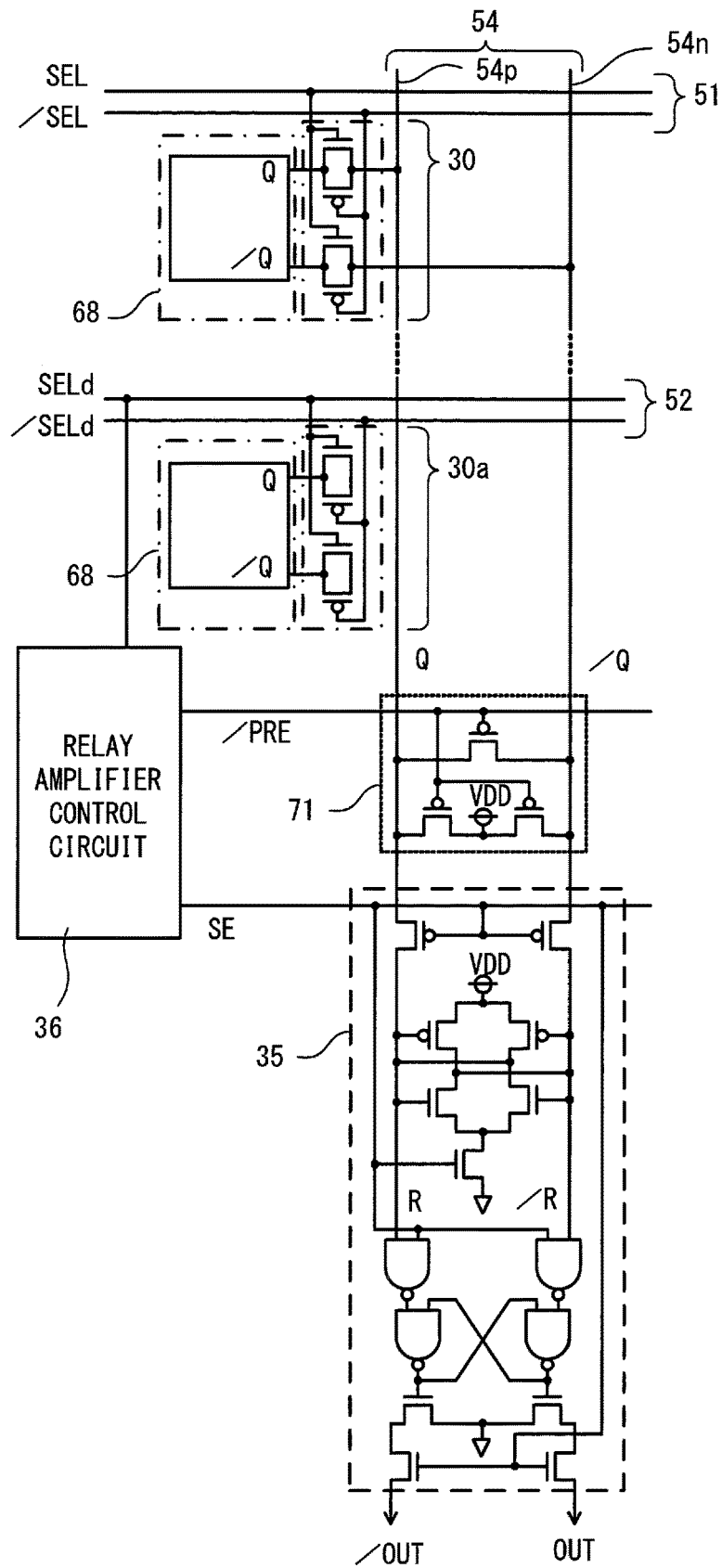
FIG. 6 is a circuit diagram schematically illustrating a configuration of one pixel block arranged in a row other than the lowermost row.

FIG. 6 is a circuit diagram schematically illustrating a configuration of one pixel block 32 arranged in a row other than the lowermost row. Note that FIG. 6 illustrates only a part relating to one storage circuit 68 among the K storage circuits 68 included in the storage unit 38. In other words, FIG. 6 illustrates only a part relating to a one-bit output. Actually, K sets of the units (excluding the relay amplifier control circuit 36) illustrated in FIG. 6 are provided.

Complementary signals Q, /Q output from the storage circuit 68 are respectively output to a positive logic signal line 54p and a negative logic signal line 54n included in the output signal line 54. A precharge circuit 71 is connected to the relay amplifier control circuit via a precharge signal line /PRE. The precharge circuit 71 performs a precharge operation, which will be described later, on the positive logic signal line 54p and the negative logic signal line 54n. After the precharge operation, the complementary signals Q, /Q are read out and output to the next pixel block 32 via the relay amplifier circuit 35. Operations of the circuit illustrated in FIG. 6 is described later in detail.

Figure 7:
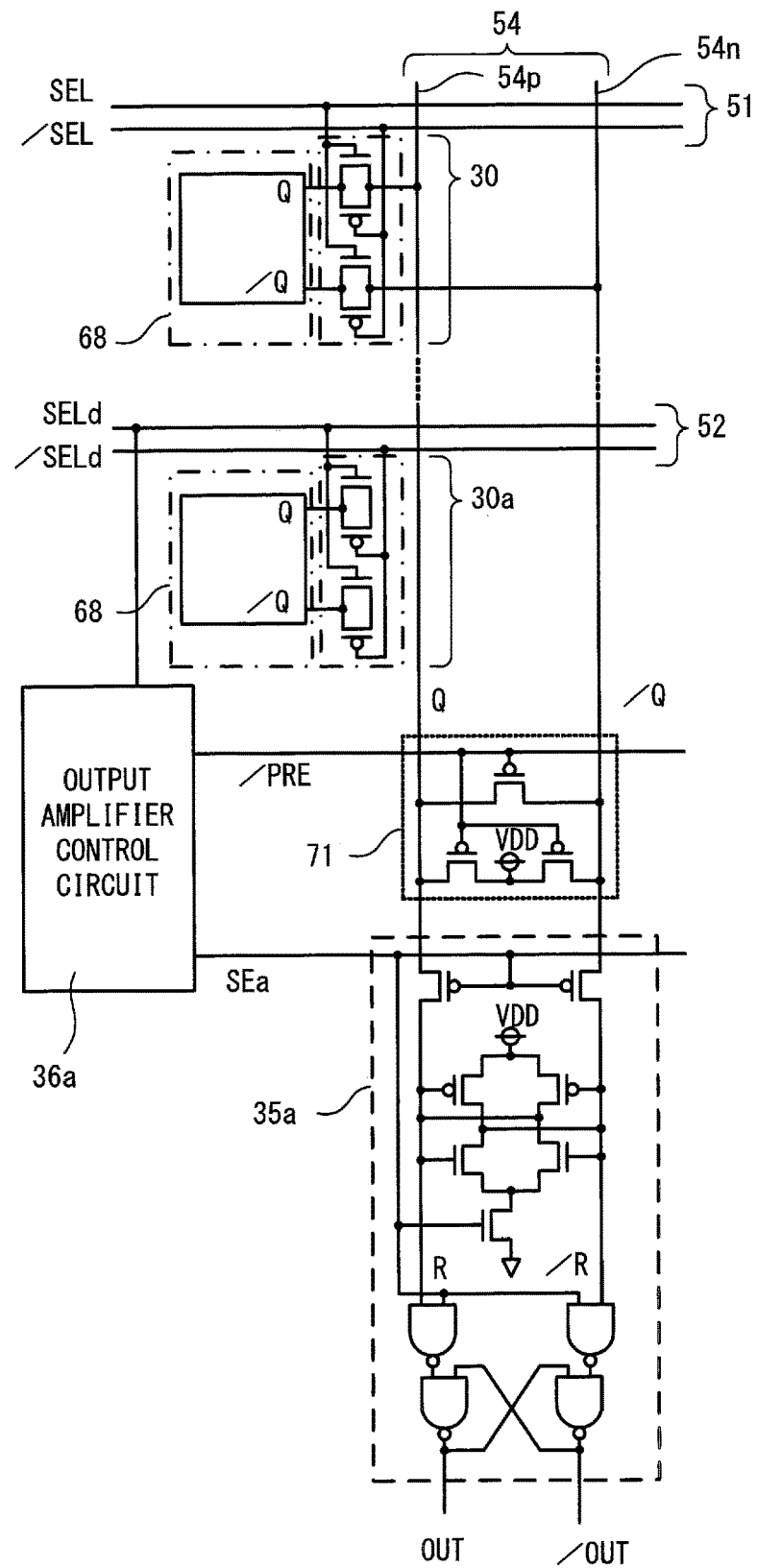
FIG. 7 is a circuit diagram schematically illustrating a configuration of one pixel block arranged in the lowermost row.

FIG. 7 is a circuit diagram schematically illustrating a configuration of one pixel block 32 arranged in the lowermost row. The pixel block 32 arranged in the lowermost row has the same configuration as those of the pixel blocks 32 arranged in rows other than the lowermost row illustrated in FIG. 6, except that the pixel block 32 in the lowermost row has an output amplifier control circuit 36a instead of the relay amplifier control circuit 36 and an output amplifier circuit 35a instead of the relay amplifier circuit 35.

Figure 8:
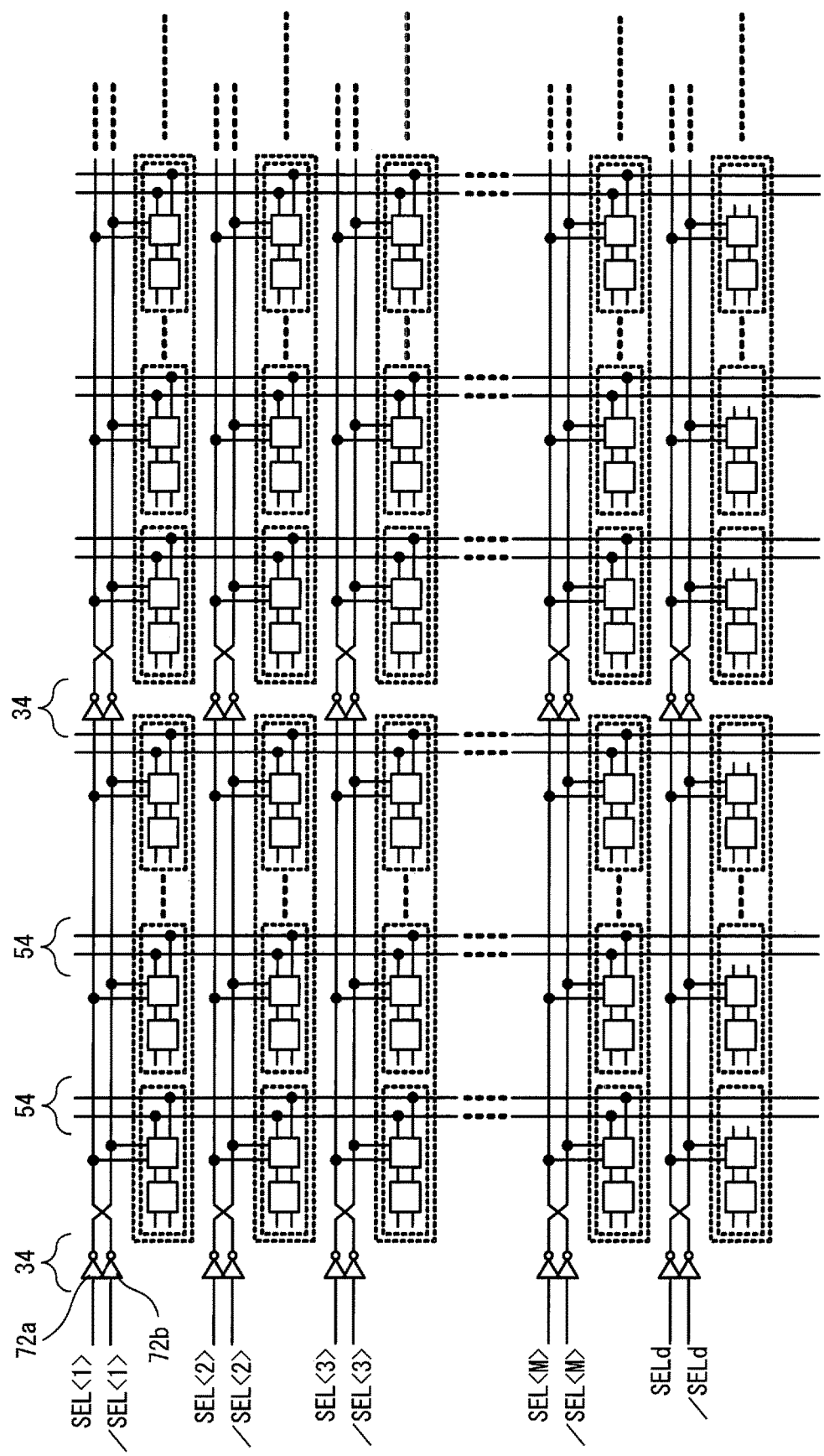
FIG. 8 is a circuit diagram schematically illustrating a configuration of a row selection signal line and a relay signal line.

FIG. 8 is a circuit diagram schematically illustrating a configuration of the row selection signal line 51 and the relay signal line 52. The relay buffer 34 has a pair of inverting buffers 72a, 72b. True and false of the row selection signal and the relay signal are inverted by the pair of inverting buffers 72a, 72b and the signals are transposed to each other after the relay buffer 34.

Figure 9:
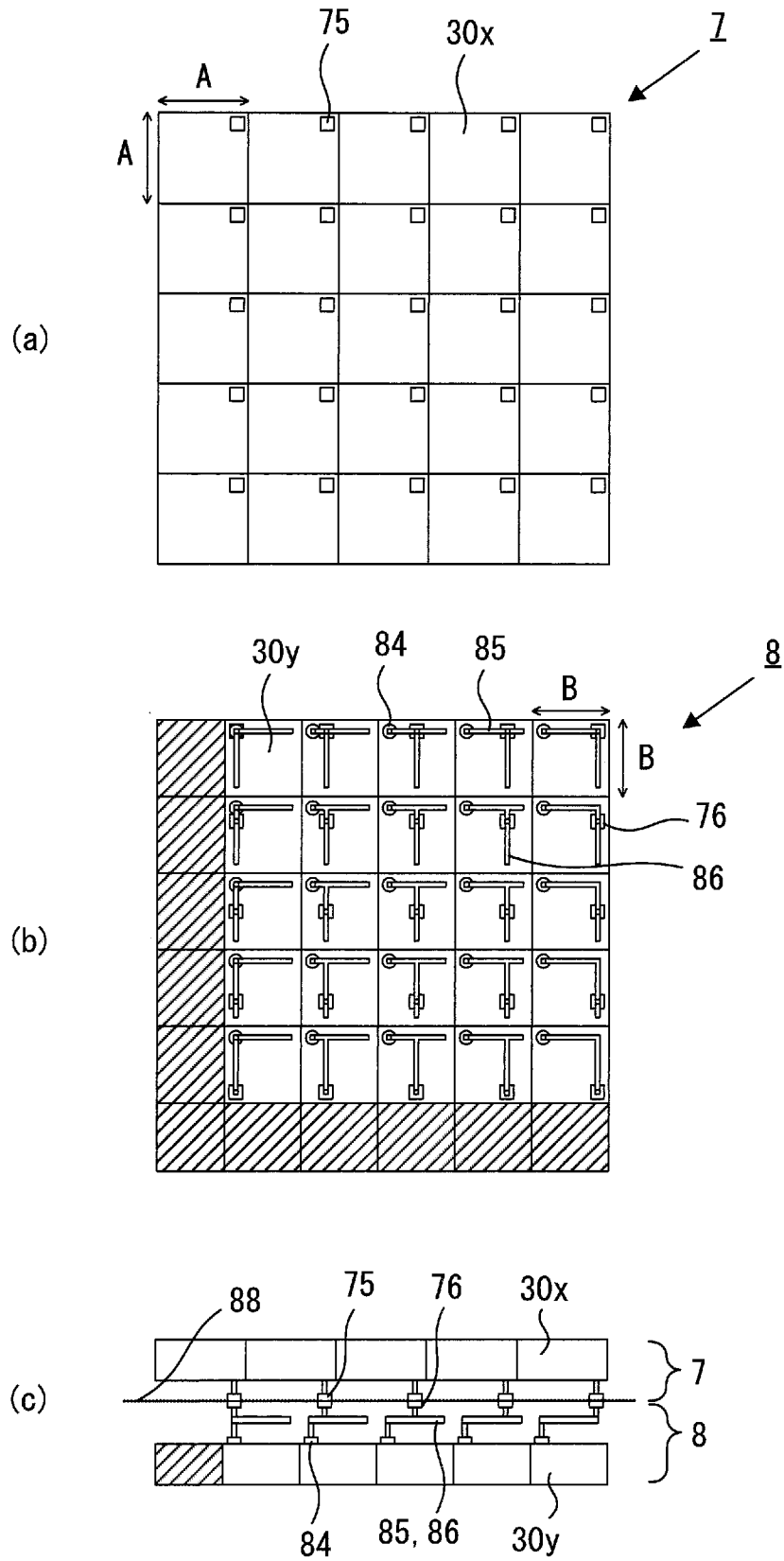
FIG. 9 is a view schematically illustrating a circuit layout of one pixel block.

FIG. 9 is a view schematically illustrating a circuit layout of one pixel block 32. FIG. 9(a) is a plan view of the first semiconductor substrate 7, FIG. 9(b) is a plan view of the second semiconductor substrate 8, and FIG. 9(c) is a cross-sectional view illustrating a relationship between the first semiconductor substrate 7 and the second semiconductor substrate 8.

In the first semiconductor substrate 7, first pixel units 30x of pixel units 30 included in one pixel block 32 are arranged two-dimensionally. In the second semiconductor substrate 8, second pixel units 30y of pixel units 30 included in one pixel block 32 are arranged two-dimensionally. The area occupied by the first pixel unit 30x is A×A, whereas the area occupied by the second pixel unit 30y is B×B that is smaller than A×A. The first pixel units 30x are arranged in the first semiconductor substrate 7 at a pitch A. On the other hand, the second pixel units 30y are arranged in the second semiconductor substrate 8 at a pitch B that is narrower than the pitch A. Thus, when equal numbers of the first pixel units 30x and the second pixel units 30y are arranged, empty regions (regions indicated by hatching in FIGS. 9(b) and 9(c)) not occupied by the second pixel units 30y are formed in the second semiconductor substrate 8.

At least one of the dummy pixel unit 30a, the relay buffer 34, the relay amplifier circuit 35, the relay amplifier control circuit 36, the output amplifier circuit 35a, the output amplifier control circuit 36a, and the like is arranged in the empty regions of the second semiconductor substrate 8 which are not occupied by the second pixel unit 30y.

As illustrated in FIG. 9(a), a bonding pad 75 is provided at the upper right corner of each first pixel unit 30x. As illustrated in FIG. 9(b), an input terminal 84 is provided at the upper left corner of each second pixel unit 30y. A horizontal wire 85 traversing the entire second pixel units 30y is provided in the horizontal direction from the input terminal 84. A vertical wire 86 traversing the entire second pixel units 30y is provided in the vertical direction from the horizontal wire 85. Positions where vertical wires 86 are provided are slightly changed depending on relative positions in the pixel block 32. Specifically, in the second pixel units 30y located at the right end in the pixel block 32, the vertical wires 86 are provided at the right ends of the second pixel units 30y. In the second pixel units 30y located at the left end in the pixel block 32, the vertical wires 86 are provided at the left ends of the second pixel units 30y. On the vertical wire 86, a bonding pad 76 is provided. Positions where the bonding pad 76 are provided are slightly changed depending on relative positions in the pixel block 32. Specifically, in the second pixel units 30y located at the upper end in the pixel block 32, the bonding pads 76 are provided at the upper ends of the second pixel units 30y. In the second pixel units 30y located at the lower end in the pixel block 32, the bonding pads 76 are provided at the lower ends of the second pixel units 30y. The bonding pads 75 of the first pixel units 30x and the bonding pads 76 of the second pixel units 30y arranged as described above are electrically connected to each other at a bonding surface 88 as illustrated in FIG. 9(c).

Figure 10:
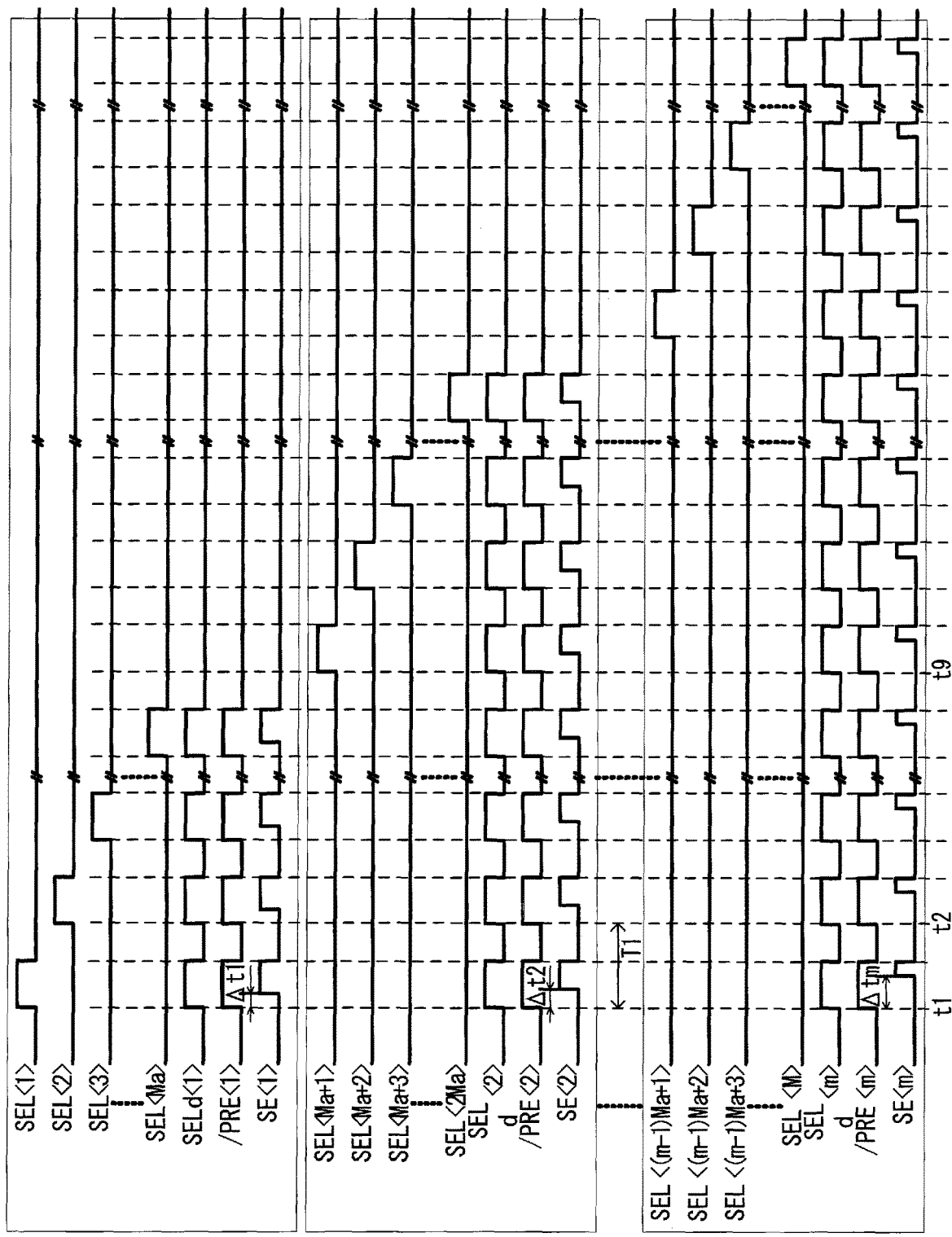
FIG. 10 is a timing chart illustrating an operation timing of the image sensor.

FIG. 10 is a timing chart illustrating an operation timing of the image sensor 3. The row selection circuit 40 sequentially outputs row selection signals to the row selection signal lines 51 of the rows respectively with a predetermined period T1. For example, in FIG. 10, a row selection signal of H (High) level is output to a row selection signal line SEL<1> of a first row at time t1, and a row selection signal of H (High) level is output to a row selection signal line SEL<2> of a second row at time t2 that is a time after the period T1 from time t1. The row selection circuit 40 repeatedly performs this operation down to a row selection signal line SEL<M> of a M-th row (the last row).

Each time the row selection circuit 40 outputs a row selection signal to a row selection signal line 51 of any one row, the row selection circuit 40 simultaneously outputs a relay signal of H level to all the relay signal lines 52. However, the row selection circuit 40 does not output the relay signal to relay signal lines 52 connected to pixel blocks 32 which has already been read out. The relay signal is a signal instructing the relay amplifier circuits 35 to relay the output signal from the upper row. Since the readout is performed sequentially from the top, there is no need to output the relay signal to pixel blocks 32 which has already been read out.

In other words, the row selection circuit 40 outputs a row selection signal to a row selection signal line 51 of a row to be read out, to output photoelectric conversion signals from pixel units 30 belonging to that row. The row selection circuit 40 further outputs relay signals to relay signal lines 52 connected to relay amplifier circuits 35 located under the target row, to relay the photoelectric conversion signals down to output amplifier circuits 35a located at the lowermost. By repeatedly performing this operation down to the row selection signal line SEL<M> of the M-th row (the last row), the row selection circuit 40 outputs the output signals from pixel units 30 of each row to the output amplifier circuits 35a.

For example, at time t1 in FIG. 10, the row selection circuit 40 outputs a row selection signal of H level to the row selection signal line SEL<1> of the first row and simultaneously outputs a relay signal to the relay signal line SELd<1> of the first line to the relay signal line SELd<m> of the m-th row (the last row). On the other hand, at time t9, when outputting a row selection signal to a row selection signal line SEL<Ma+1> of a (Ma+1)-th row, no relay signal is output to the relay signal line SELd<1> of the first row. This is because all the pixel units 30 included in the pixel blocks 32 to which the relay signal line SELd<1> of the first row is connected have already been read out, so that the relay amplifier circuits 35 in the pixel blocks 32 need not relay the output signals.

The relay signal output to the relay signal line 52 is input to the relay amplifier control circuit 36. In response to the relay signal, the relay amplifier control circuit 36 outputs a precharge signal to a precharge signal line /PRE. After a predetermined waiting time (described later) has elapsed since the precharge signal was output, the relay amplifier control circuit 36 outputs a relay amplifier control signal to the relay amplifier control line SE. In response to the relay amplifier control signal, all the relay amplifier circuits 35 connected to the relay amplifier control circuit 36 latch (store) the output signals output to the output signal lines 54 and output (relay) the output signals to the next pixel block 32 (a pixel block 32 below and adjacent to the target pixel block 32). The same applies to the output amplifier control circuit 36a and the output amplifier circuits 35a, but the output amplifier circuits 35a output signals to a frame memory (not illustrated) instead of the next pixel block 32.

Figure 11:
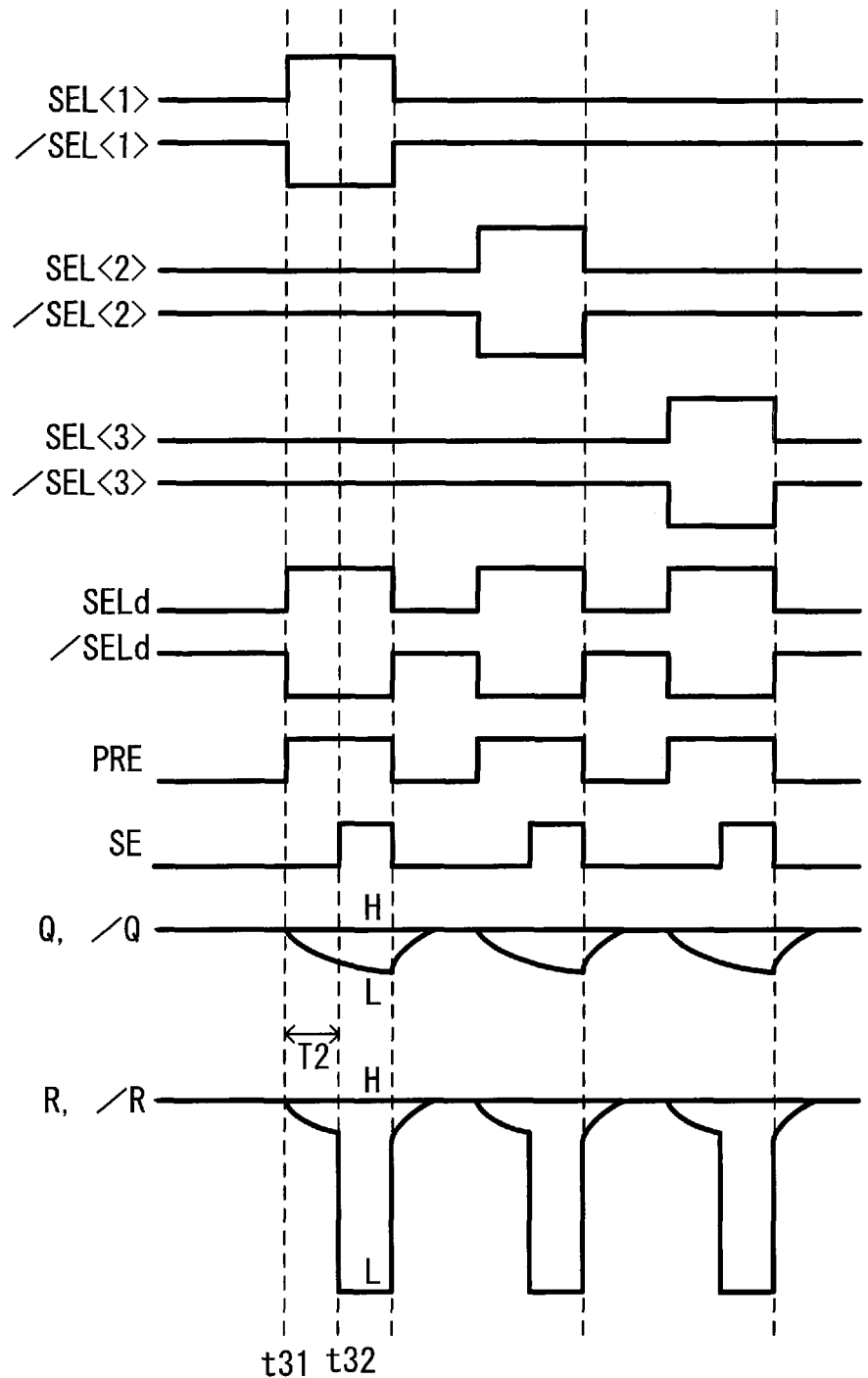
FIG. 11 is a timing chart illustrating an operation timing of one pixel block.

FIG. 11 is a timing chart illustrating an operation timing of one pixel block 32. In FIG. 11, among a plurality of row selection signal lines 51 connected to a target pixel block 32, a row selection signal line 51 of a first row is denoted as a signal line SEL<1> and the signal line /SEL<1>, a row selection signal line 51 of a second row is denoted as a signal line SEL<2> and the signal line /SEL<2>, and a row selection signal line 51 of a third row is denoted as a signal line SEL<3> and the signal line /SEL<3>. Furthermore, the output signal line 54 is denoted as a signal line Q and a signal line /Q, and the output signal in the relay amplifier circuit 35 is denoted as a signal line R and a signal line /R (see FIG. 6).

Until time t31, the signal level of the precharge signal line /PRE is set to L level and both the signal line Q and the signal line /Q are set to H level (a precharge operation).

At time t31, the row selection circuit 40 outputs a row selection signal to the row selection signal line 51 of the first row and a relay signal to the relay signal line 52. In response to the relay signal, the relay amplifier control circuit 36 stops a precharge signal to the precharge signal line /PRE. In other words, the signal level of the precharge signal line /PRE is set to H level. At this time, since the signal level of the relay amplifier control line SE is L level, changes in the signal line Q and the signal line /Q are reflected in the signal levels of the signal line R and the signal line /R in the relay amplifier circuit 35. In other words, the signal levels of the signal line R and the signal line /R in the relay amplifier circuit 35 are both H levels.

Thereafter, in the pixel unit 30 of the first row, the selection switch 69 is turned on to output the output signals to the output signal line 54. As described above, the output signals are complementary signals. A signal of H level is output to one of the signal line Q and the signal line /Q, and a signal of L level is output to the other signal line. By outputting such output signals while the signal level of the signal line Q and the signal line /Q are both set to H level by the precharge operation, the signal level of one of the signal line Q and the signal line /Q remains at H level and the signal level of the other signal line gradually approaches L level (the electric potential decreases). Since the output signal line 54 has a certain distance in the row direction (the longitudinal direction in the plane of paper of FIG. 6), the signal of L level is not immediately transmitted to the relay amplifier circuit 35. Since the signal level of the relay amplifier control line SE is L level from time t31, changes in the signal line Q and the signal line /Q are reflected in the signal levels of the signal line R and the signal line /R in the relay amplifier circuit 35 (one signal level remains to be H level, the other gradually approaches L level).

At time t32 after the waiting time T2 has elapsed from time t31, the relay amplifier control circuit 36 outputs a relay amplifier control signal to the relay amplifier control line SE. As a result, the signal level of the relay amplifier control line SE changes (amplifies) from L level to H level. When the signal level of the relay amplifier control line SE becomes H level, the signal line R and the signal line /R in the relay amplifier circuit 35 are disconnected from the signal line Q and the signal line /Q, and the relay amplifier circuit 35 is activated. In other words, the signal levels of the signal line Q and the signal line /Q are latched, and a signal of H level or L level is output from the relay amplifier circuit 35 in accordance with the latched signal level. By performing the above operation for each row, output signals from the pixel units 30 belonging to each row are relayed by the relay amplifier circuit 35.

With reference to FIG. 10, the waiting time since the precharge signal was output will be described. In FIG. 10, the waiting time in the uppermost pixel block 32 is denoted as Δt1, the waiting time in the pixel block 32 immediately under the uppermost pixel block 32 is denoted as Δt2, and the waiting time in the lowermost pixel block 32 is denoted as Δtm.

The waiting time Δt1 in the uppermost pixel block 32 is determined in accordance with a time constant of the output signal line 54 in the pixel block 32. In other words, as described in FIG. 11, the signal level of one of signal line Q and signal line /Q gradually approaches L level from time t31. If the waiting time Δt1 is short, the output signal is latched before the signal level sufficiently decreases, so that a signal of L level cannot be output from the relay amplifier circuit 35. The waiting time Δt1 is thus set such that the signal level sufficiently approaches L level.

Similarly, the waiting time Δt2 in the pixel block 32 located one row below is set such that the output signal output by the relay amplifier circuit 35 of the uppermost pixel block 32 is sufficiently transmitted to the relay amplifier circuit 35 in the "block 32 located one row below". In other words, Δt2>Δt1. Similarly, the waiting times in the subsequent pixel blocks 32 gradually become longer toward the lowermost. In other words, the waiting times in the pixel blocks 32 become gradually shorter toward the uppermost. Finally, the waiting time Δtm in the lowermost pixel block 32 is the largest waiting time.

In the row selection signal and the relay signal, the length of the period during which the signal level is H level has to be determined in consideration of the largest waiting time Δtm. In other words, in the row selection signal and the relay signal, the length of the period during which the signal level is H level has to be longer than at least Δtm, as illustrated in FIG. 10.

According to the above-described embodiment, the following operational advantages can be achieved.

(1) The row selection circuit 40 is connected to the relay signal line 52 and the plurality of row selection signal lines 51. The row selection circuit 40 sequentially outputs a row selection signal to the plurality of row selection signal lines 51, and outputs a relay signal to the relay signal line 52 each time the row selection circuit 40 outputs the row selection signal to the plurality of row selection signal lines 51. The relay amplifier control circuit 36 is connected to the relay signal line 52 and the plurality of output signal lines 54. Each time a relay signal is output to the relay signal line 52, the relay amplifier control circuit 36 reads out output signals output from the pixel units 30 to the plurality of output signal lines 54 and then outputs the output signals to the plurality of output signal lines 54 connected to the next pixel block 32. In this way, a signal delay caused by a distance between pixel units 30 can be reduced, so that both a high number of pixels and a high readout speed can be achieved.

(2) Storage units 38 in the dummy pixel unit 30a among the plurality of storage units 38 capable of storing digital values are connected to the relay signal line 52, and a plurality of storage units 38 in the pixel units 30 among the plurality of storage units 38 are connected to a respective one of the plurality of row selection signal lines 51. When the row selection signal is input, the storage units 38 in the pixel units 30 output signals based on the stored digital values to the plurality of output signal lines 54. In this way, since the dummy pixel unit 30a for receiving the relay signal has the storage unit 38 and the like in the same manner as the normal pixel units 30, a delay difference between the row selection signal and the relay signal caused by a difference in circuit configurations can be reduced.

(3) In all the pixel blocks 32 except for the pixel block 32 at the end among the plurality of pixel blocks 32 each including the plurality of storage units 38 and the relay amplifier circuit 35, the plurality of output signal lines 54 are connected to a plurality of output signal lines 54 of another pixel block 32. In this way, signals are relayed between the pixel blocks 32 by the relay amplifier circuit 35. Thus, a signal delay, a delay in signal falling, a distortion in waveform, and the like caused by a difference in distances between the pixel units 30 can be avoided, so that a high readout speed can be achieved even when there are a large number of pixel units 30.

(4) The plurality of pixel block columns 33, each including the plurality of pixel blocks 32, are connected to each other via the plurality of row selection signal lines 51. Furthermore, the relay buffers 34 that relay row selection signals are provided between the plurality of pixel block columns 33. In this way, the influence of the signal delay and the like on the row selection signals can be minimized even in pixel units 30 far from the row selection signal output unit 41.

(5) When a predetermined waiting time, which is shorter as the distance from the pixel block 32 at the terminal end is larger, has elapsed after the relay signal was input, the relay amplifier circuit 35 reads out output signals output to the plurality of output signal lines 54 and then outputs the output signals to the plurality of output signal lines 54 connected to the next pixel block 32. In this way, the output signal can be read out correctly even when there are a large number of pixel blocks 32.

(6) The plurality of photodiodes 31 corresponding to other storage units 38 are further provided, and the other storage units 38 store digital values of photoelectric conversion signals output by the plurality of photodiodes 31. In this way, a digital signal can be output for each pixel unit 30, so that the output signals can be easily transmitted as compared with analog signals.

(7) The first semiconductor substrate 7 is provided with a plurality of photodiodes 31. The plurality of storage units 38 and the relay amplifier circuit 35 are provided in a place different from the first semiconductor substrate 7. In this way, the opening area of the photodiode 31 is not reduced due to the plurality of storage units 38 and the relay amplifier circuit 35.

(8) The second semiconductor substrate 8 is provided with a plurality of storage units 38 and a relay amplifier circuit 35. The plurality of photodiodes 31 are arranged in the first semiconductor substrate 7 at a first pitch, and the plurality of storage units 38 are arranged in the second semiconductor substrate 8 at a second pitch that is narrower than the first pitch. The relay amplifier circuit 35 and other circuits are arranged in the remaining space. In this way, the circuits can be mounted while keeping the light receiving area of the photodiode 31.

(9) As illustrated in FIG. 8, the inverting buffers 72*a*, 72*b* can be used to achieve a reduction in space and power as compared with a case of using non-inverting buffers. Additionally, since the signal line SEL and the signal line /SEL are inverted to each other for each pixel block 32, any signal delay error between the two signal lines is relaxed.

(10) As illustrated in FIG. 9(*b*), the wire lengths of the horizontal wire 85 and the vertical wire 86 are the same in all the pixel units 30. Thus, parasitic capacitance of the horizontal wire 85 and the vertical wire 86 are the same for all the pixel units 30, so that variations of the signal delays and the like of the pixel units 30 can be reduced.

(11) The plurality of storage units 38 are provided in the horizontal direction to store signals output from the pixel units 30 having the photodiodes 31. The row selection circuit 40 outputs a row selection signal for outputting signals stored in the plurality of storage units 38. The output amplifier circuits 35*a* read out the signals output from the storage units 38. The plurality of dummy pixel units 30*a* are connected to the row selection circuit 40. The output amplifier control circuit 36*a* controls the readout of the signals by the output amplifier circuits 35*a*. The row selection circuit 40 outputs a relay signal to the plurality of dummy pixel units 30*a* together with the row selection signal. The output amplifier control circuit 36*a* controls the readout of the signals by the output amplifier circuits 35*a* based on the relay signal. In this way, a signal delay caused by a distance between pixel units 30 can be reduced, so that both a high number of pixels and a high readout speed can be achieved.

(12) The plurality of output amplifier circuits 35*a* read out the signals output from the plurality of respective storage units 38. In this way, the output signals from a large number of storage units 38 can be read out correctly.

(13) The row selection circuit 40 outputs a row selection signal to a plurality of storage units 38 provided in the horizontal direction, and outputs a relay signal to a plurality of dummy pixel units 30*a* provided in the horizontal direction. In this way, a signal delay difference caused by a difference in circuit configurations can be reduced.

(14) The plurality of sets of the plurality of storage units 38, which are arranged in the horizontal direction, are arranged in a direction intersecting the horizontal direction. The row selection circuit 40 sequentially outputs a row selection signal to a plurality of storage units 38 provided in a direction intersecting the horizontal direction, and outputs a relay signal to a plurality of dummy pixel units 30*a* provided in the horizontal direction. In this way, the output signals from a large number of storage units 38 can be read out correctly.

(15) The output amplifier control circuit 36*a* controls a plurality of output amplifier circuits 35*a* provided in the horizontal direction based on the relay signal. In this way, the output signals from a large number of storage units 38 can be read out correctly.

(16) The output amplifier control circuit 36*a* controls a timing of the readout of the signals by the output amplifier circuits 35*a* based on the relay signal. In this way, the output signals from a large number of storage units 38 can be read out correctly.

(17) The output amplifier control circuit 36*a* performs the readout of the signals by the output amplifier circuits 35*a* after a predetermined time has elapsed since the relay signal was received. In this way, the output signals from a large number of storage units 38 can be read out correctly.

(18) The output amplifier control circuit 36*a* changes a predetermined time from the reception of the relay signal to the readout of the signals by the output amplifier circuit 35*a*, based on a spacing between the storage unit 38 and the output amplifier circuit 35*a*. In this way, both the output signal from the faraway storage unit 38 and the output signal from the nearby storage unit 38 can be read out correctly.

(19) The output amplifier control circuit 36*a* reduces the predetermined time from the reception of the relay signal to the readout of the signals by the output amplifier circuits 35*a* as the spacing between the storage unit 38 and the output amplifier circuit 35*a* is larger. In this way, both the output signal from the faraway storage unit 38 and the output signal from the nearby storage unit 38 can be read out correctly.

(20) The plurality of output amplifier control circuits 36*a* are provided in the horizontal direction. In this way, the output signals from a large number of storage units 38 can be read out correctly.

(21) The relay amplifier circuits 35 amplify the signals output from the storage units 38. The relay amplifier control circuit 36 controls the amplification of the signals by the relay amplifier circuits 35. The row selection circuit 40 outputs a relay signal to the plurality of dummy pixel units 30*a* together with the row selection signal. The relay amplifier control circuit 36 controls the amplification of the signals by the relay amplifier circuits 35 based on the relay signal. In this way, the dummy pixel unit 30*a* located away from the row selection circuit 40 can be correctly operated.

(22) The plurality of relay amplifier circuits 35 amplify the signals output from the plurality of respective storage units 38. In this way, the output signal can be read out correctly even when there are a large number of storage units 38.

(23) The relay amplifier control circuit 36 controls a plurality of relay amplifier circuits 35 provided in the horizontal direction, based on the relay signal. In this way, the output signal can be read out correctly even when there are a large number of relay amplifier circuits 35.

(24) The relay amplifier control circuit 36 controls a timing of the amplification of the signals by the relay amplifier circuits 35, based on the relay signal. In this way, the output signals from a large number of storage units 38 can be read out correctly.

(25) The relay amplifier control circuit 36 preforms amplification of the signals by the relay amplifier circuits 35 after a predetermined time has elapsed since the relay signal was input. In this way, the output signals from a large number of storage units 38 can be read out correctly.

(26) The relay amplifier control circuit 36 changes the predetermined time from the input of the relay signal to the amplification of the signals by the relay amplifier circuits 35, based on the spacing between the storage unit 38 and the relay amplifier circuit 35. In this way, both the output signal from the faraway storage unit 38 and the output signal from the nearby storage unit 38 can be read out correctly.

(27) The relay amplifier control circuit 36 reduces the predetermined time from the input of the relay signal to the amplification of the signals by the relay amplifier circuits 35, as the spacing between the storage unit 38 and the relay amplifier circuit 35 is larger. In this way, both the output signal from the faraway storage unit 38 and the output signal from the nearby storage unit 38 can be read out correctly.

(28) The plurality of relay amplifier control circuits 36 are provided in a direction intersecting the horizontal direction.

In this way, the output signal can be read out correctly even when there are a large number of storage units 38.

(29) The output amplifier circuit 35*a* reads out the signal amplified by the relay amplifier circuit 35. In this way, the output signals from a large number of storage units 38 can be read out correctly.

(30) The relay buffer 34 is provided between at least one storage unit 38 among the plurality of storage units 38 provided in the horizontal direction and the row selection circuit 40. A row selection signal is input to the relay buffer 34. In this way, the influence of the signal delay and the like on the row selection signals can be minimized even in pixel units 30 far from the row selection signal output unit 41.

(31) The plurality of relay buffers 34 are provided between at least one of the plurality of storage units 38 and the row selection circuit 40. In this way, the output signals from a large number of storage units 38 can be read out correctly.

(32) The relay buffer 34 stores or amplifies at least the input row selection signal. In this way, the influence of the signal delay and the like on the row selection signals can be minimized even in pixel units 30 far from the row selection signal output unit 41.

(33) The relay buffer 34 is provided between at least one dummy pixel unit 30*a* among the plurality of dummy pixel units 30*a* provided in the horizontal direction and the row selection circuit 40. A relay signal is input to the relay buffer 34. In this way, a signal delay difference caused by a difference in circuit configurations can be reduced.

(34) The plurality of relay buffers 34 are provided between at least one dummy pixel unit 30*a* among the plurality of dummy pixel units 30*a* and the row selection circuit 40. In this way, the output signals from a large number of storage units 38 can be read out correctly.

(35) The relay buffer 34 stores or amplifies at least the input relay signal. In this way, the influence of the signal delay and the like on the row selection signals can be minimized even in pixel units 30 far from the row selection signal output unit 41.

(36) The first semiconductor substrate 7 is provided with a plurality of photodiodes 31. The second semiconductor substrate 8 is provided with at least one of a set of a plurality of storage units 38, a set of a plurality of dummy pixel units 30*a*, an output amplifier circuit 35*a*, and an output amplifier control circuit 36*a*. The first semiconductor substrate 7 and the second semiconductor substrate 8 are provided from the side on which light is incident. In this way, the opening area of the photodiode 31 is not reduced due to the plurality of storage units 38 and the output amplifier circuit 35*a*.

(37) The plurality of photodiodes 31 are provided in the first semiconductor substrate 7 at the first pitch. The plurality of storage units 38 are provided at a second pitch smaller than the first pitch in the second semiconductor substrate 8. The plurality of dummy pixel units 30*a* are provided at the second pitch in the second semiconductor substrate 8. In this way, the circuits can be mounted while keeping the light receiving area of the photodiode 31.

(38) The plurality of storage units 38 store signals output from the pixel units 30 having the photodiodes 31. The row selection circuit 40 outputs a row selection signal for outputting signals stored in the plurality of storage units 38. The relay amplifier circuits 35 amplify the signals output from the storage units 38. The plurality of dummy pixel units 30*a* are connected to the row selection circuit 40. The relay amplifier control circuit 36 controls the amplification of the signals by the relay amplifier circuits 35. The row selection circuit 40 outputs a relay signal to the plurality of dummy pixel units 30*a* together with the row selection signal. The relay amplifier control circuit 36 controls the amplification of the signals by the relay amplifier circuits 35, based on the relay signal. In this way, a signal delay caused by a distance between pixel units 30 can be reduced, so that both a high number of pixels and a high readout speed can be achieved.

(39) The control unit 4 generates image data based on a signal from the image sensor 3. In this way, an image having a high number of pixels can be created at a high speed.

The following modification is also within the scope of the present invention, and one or more of the modifications may be combined with the above-described embodiment.

(First Modification)

The pixel block column 33 may be configured to include one pixel block 32 instead of the plurality of pixel blocks 32. In other words, the relay amplifier circuit 35, the relay amplifier control circuit 36, the relay signal output unit 42, and the like are not necessarily provided.

While various embodiments and modifications have been described above, the present invention is not limited thereto. Other embodiments contemplated within the technical idea of the present invention are also included within the scope of the present invention.

The disclosure of the following priority application is herein incorporated by reference:

Japanese Patent Application No. 2016-69737 (filed Mar. 30, 2016)

REFERENCE SIGNS LIST

1 . . . image-capturing apparatus, 2 . . . image-capturing optical system, 3 . . . image sensor, 30 . . . pixel unit, 31 . . . photodiode, 32 . . . pixel block, 33 . . . pixel block column, 34 . . . relay buffer, 35 . . . relay amplifier circuit, 35*a* . . . output amplifier circuit, 36 . . . relay amplifier control circuit, 36*a* . . . output amplifier control circuit, 38 . . . storage unit, 40 . . . row selection circuit, 41 . . . row selection signal output unit, 42 . . . relay signal output unit, 51 . . . row selection signal line, 52 . . . relay signal line, 54 . . . output signal line

The invention claimed is:

1. An image sensor comprising:
a plurality of first circuits that are provided in a row direction and that output signals based on electric charges generated by photoelectric conversion circuits;
a first control circuit to which the plurality of first circuits are connected and which outputs first signals that cause the signals to be output from the plurality of first circuits;
a readout circuit that reads out the signals output from the plurality of first circuits;
a plurality of second circuits that are provided in the row direction and that are connected to the first control circuit; and
a second control circuit that is provided between the plurality of second circuits, that is connected to the plurality of second circuits, and that controls a timing of a readout of the signals by the readout circuit, wherein
the first control circuit outputs second signals together with the first signals to the plurality of second circuits, and
the second control circuit controls the timing of the readout of the signals by the readout circuit based on the second signals.

2. The image sensor according to claim 1, further comprising
a first control signal line that is connected to the first control circuit and that outputs the first signals to the plurality of first circuits provided in the row direction; and
a second control signal line that is connected to the first control circuit and that outputs the second signals to the plurality of second circuits provided in the row direction.

3. The image sensor according to claim 2, wherein the second control circuit is connected to the second control signal line.

4. The image sensor according to claim 1, wherein the number of the second circuits provided in the row direction is the same as the number of the first circuits provided in the row direction.

5. The image sensor according to claim 1, wherein the first circuits and the second circuits are circuits having a same configuration or circuits having a same resistance value.

6. The image sensor according to claim 1, wherein the plurality of first circuits are provided in a column direction, and
the first control circuit outputs the second signals to the plurality of second circuits provided in the row direction every time the first control circuit sequentially outputs the first signals to the plurality of first circuits provided in the column direction.

7. The image sensor according to claim 1, wherein the readout circuit comprises a plurality of readout circuits provided in the row direction, and
the plurality of readout circuits respectively read out the signals output from the plurality of first circuits provided in the row direction.

8. The image sensor according to claim 1, wherein the readout circuit comprises a plurality of readout circuits provided in the row direction, and the second control circuit controls the plurality of readout circuits provided in the row direction based on the second signals.

9. The image sensor according to claim 8, wherein the second control circuit controls the timing of the readout of the signals by the plurality of readout circuits provided in the row direction based on the second signals.

10. The image sensor according to claim 1, further comprising
a plurality of amplifier circuits that amplify the signals output from the first circuits; and
a third control circuit that controls the amplification of the signals by the plurality of amplifier circuits, wherein
the first control circuit outputs third signals together with the first signals to the plurality of amplifier circuits, and
the third control circuit controls the amplification of the signals by the plurality of amplifier circuits based on the third signals.

11. The image sensor according to claim 10, wherein the plurality of amplifier circuits are provided in the row direction, and
the plurality of amplifier circuits respectively amplify the signals output from the plurality of first circuits provided in the row direction.

12. The image sensor according to claim 10, wherein the third control circuit controls a timing of the amplification of the signals by the plurality of amplifier circuits provided in the row direction based on the third signals.

13. The image sensor according to claim 1, wherein the first circuits are AD conversion circuits that convert analog signals that are based on the electric charges generated by the photoelectric conversion circuits into digital signals.

14. The image sensor according to claim 1, wherein the first circuits are storage circuits that store the signals that are based on the electric charges generated by the photoelectric conversion circuits.

15. The image sensor according to claim 1, further comprising
a first substrate that has the photoelectric conversion circuits; and
a second substrate that has the first circuits, the second circuits, and the readout circuits and that is layered on the first substrate.

16. An imaging device comprising:
the image sensor according to claim 1; and
a generation unit that generates image data based on the signals output from the image sensor.

17. The image sensor according to claim 10, wherein the amplifier circuits and the third control circuit are provided between the plurality of first circuits in the column direction.

* * * * *